United States Patent
Sullivan et al.

(10) Patent No.: US 7,723,976 B2
(45) Date of Patent: May 25, 2010

(54) SELF-ADJUSTING HOLD-OFF TRIGGER

(75) Inventors: Steven K. Sullivan, Beaverton, OR (US); Kenneth P. Dobyns, Beaverton, OR (US); Paul M. Gerlach, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 268 days.

(21) Appl. No.: 11/781,202

(22) Filed: Jul. 20, 2007

(65) Prior Publication Data

US 2008/0030239 A1 Feb. 7, 2008

Related U.S. Application Data

(60) Provisional application No. 60/835,562, filed on Aug. 3, 2006.

(51) Int. Cl.
*G01R 13/34* (2006.01)
*G01R 13/14* (2006.01)
(52) U.S. Cl. ............ 324/76.38; 324/76.15; 324/121 R
(58) Field of Classification Search ............. 324/76.15, 324/76.38, 121 R
See application file for complete search history.

(56) References Cited

U.S. PATENT DOCUMENTS

| | | | |
|---|---|---|---|
| 4,771,193 A | 9/1988 | Ohta | |
| 5,223,784 A | 6/1993 | Nelson | |
| 5,841,286 A * | 11/1998 | Stoops | 324/511 |
| 6,621,913 B1 | 9/2003 | de Vries | |
| 6,753,677 B1 * | 6/2004 | Weller et al. | 324/121 R |
| 7,072,804 B2 | 7/2006 | Weller | |
| 2003/0220753 A1 * | 11/2003 | Pickerd et al. | 702/67 |

* cited by examiner

*Primary Examiner*—Amy He
(74) *Attorney, Agent, or Firm*—Francis I. Gray; Thomas F. Lenihan

(57) ABSTRACT

A self-adjusting hold-off trigger circuit and method detects a threshold crossing between consecutive samples of a digitized input signal as edge events, identifies the crossing as a qualified trigger event if the crossing is in a desired direction based upon trigger criteria, and provides a trigger output when the qualified trigger event occurs greater than an approximate average or peak time after a preceding edge event.

12 Claims, 4 Drawing Sheets

SELF-ADJUSTING HOLD-OFF TRIGGER

CROSS-REFERENCE TO RELATED APPLICATIONS

The current application is a non-provisional application based upon and claiming the filing date under 35 U.S.C. 119(e) of provisional application Ser. No. 60/835,562, filed on Aug. 3, 2006, which provisional application is abandoned upon the filing of this non-provisional application.

BACKGROUND OF THE INVENTION

The present invention relates to acquisition of an input signal, and more particularly to a self-adjusting hold-off trigger for an acquisition system which is based on approximate time between trigger level crossings by the input signal.

U.S. Pat. No. 7,072,804, issued to Dennis J. Weller on Jul. 4, 2006, discloses a digital trigger circuit having an input filter for producing low and high frequency rejection trigger signals, as well as AC and DC trigger signals, derived from a digitized input signal. One of the four trigger signals is selected by a multiplexer and input to a trigger comparator having an upper trigger level and a lower trigger level to provide a desired amount of hysteresis, one trigger level being a desired trigger level and the other being a hysteresis level.

The hysteresis in the trigger comparator provides a noise rejection function. Low levels of noise are ignored. For rising edge trigger events, without hysteresis the noise may cause the falling edge of the digitized input signal to be detected as a rising edge. As shown in FIG. 1 a rising edge is detected on the transition from point A to point B. Without hysteresis other rising edges are detected on the transitions from point C to point D and again from point K to point L. A measurement instrument operator, attempting to trigger on rising edges, gets annoyed when the measurement instrument triggers on the transition from point K to point L, since this is clearly part of an overall falling edge. When the horizontal display scale is such that points J, K, L and M all occur within the same display column, the presence of a rising edge is not visible, and it appears that the acquisition system trigger circuit is malfunctioning. By adding hysteresis in the trigger comparator, as shown, the trigger circuit no longer triggers on the transition from point K to point L. A rising trigger edge only happens after the signal has passed below the hysteresis level and then passes above the desired trigger level.

Unfortunately a trigger comparator with hysteresis waits until the input trigger signal has passed above or below both levels (depending upon whether triggering is on the rising or falling edge of a signal) so that it doesn't mistakenly trigger on noise. When a state machine, which generates a trigger from the output of the trigger comparator, is set up for pulse width triggering, this may result in an error since the measured width from above the high level to below the low level may not accurately reflect the pulse width at the desired trigger level. Also rising edge trigger events stop occurring when the trigger level is near the minimum peak value for the digitized input signal, and falling edge trigger events stop occurring when the trigger level is near the maximum peak value for the digitized input signal.

U.S. Pat. No. 4,771,193, issued to Genichiro Ohta on Sep. 13, 1988 shows an analog circuit for triggering on a maximum length pulse within an input signal. As shown in FIG. 2 of the '193 patent, an input digital signal (a) produces a ramp signal (b) for each pulse, the height of the ramp being a function of the width of the pulse. A capacitor is charged, as shown by signal (c), and enables a sweep (I) that starts at the conclusion of the longest pulse. In this way the measuring instrument triggers on a non-signal interval indicated by the longest pulse width. This trigger circuit operates on a peak detection basis, i.e., triggering on the highest peak of the ramp signal (b).

U.S. Pat. No. 5,223,784, issued to Theodore G. Nelson, et al on Jun. 29, 1993, shows a circuit for triggering an acquisition system only once during a period of an input signal. A first trigger comparator detects qualifying trigger events in an input signal using a first reference trigger level, which qualifying trigger events charge a capacitor. A second trigger comparator compares the voltage on the capacitor with a second reference trigger level, and produces a pulse if the capacitor voltage has a predetermined relationship to the second reference trigger level. Subsequent trigger events which occur before a predetermined period of time, determined by an RC time constant, are unable to produce another trigger event.

The above-discussed patents are analog trigger circuit implementations. With the current digital storage oscilloscopes digital trigger circuit implementations are generally desired. Also these patents do not consider measuring an average duration between threshold crossings and then triggering only when a potential trigger event is preceded by a time related to the average duration.

What is desired is a self-adjusting hold-off trigger that uses an approximate time based upon average or peak time or duration between a qualified trigger event and a preceding edge event.

BRIEF SUMMARY OF THE INVENTION

Accordingly the present invention provides a self-adjusting hold-off trigger circuit that detects a threshold crossing between consecutive samples of a digitized input signal as edge events, identifies the crossing as a qualified trigger event if the crossing is in a desired direction based upon trigger criteria, and provides a trigger output when the qualified trigger event occurs greater than an approximate average or peak time after a preceding edge event.

The objects, advantages and other novel features of the present invention are apparent from the following detailed description when read in conjunction with the appended claims and attached drawing.

DETAILED DESCRIPTION OF THE INVENTION

Figure 1:
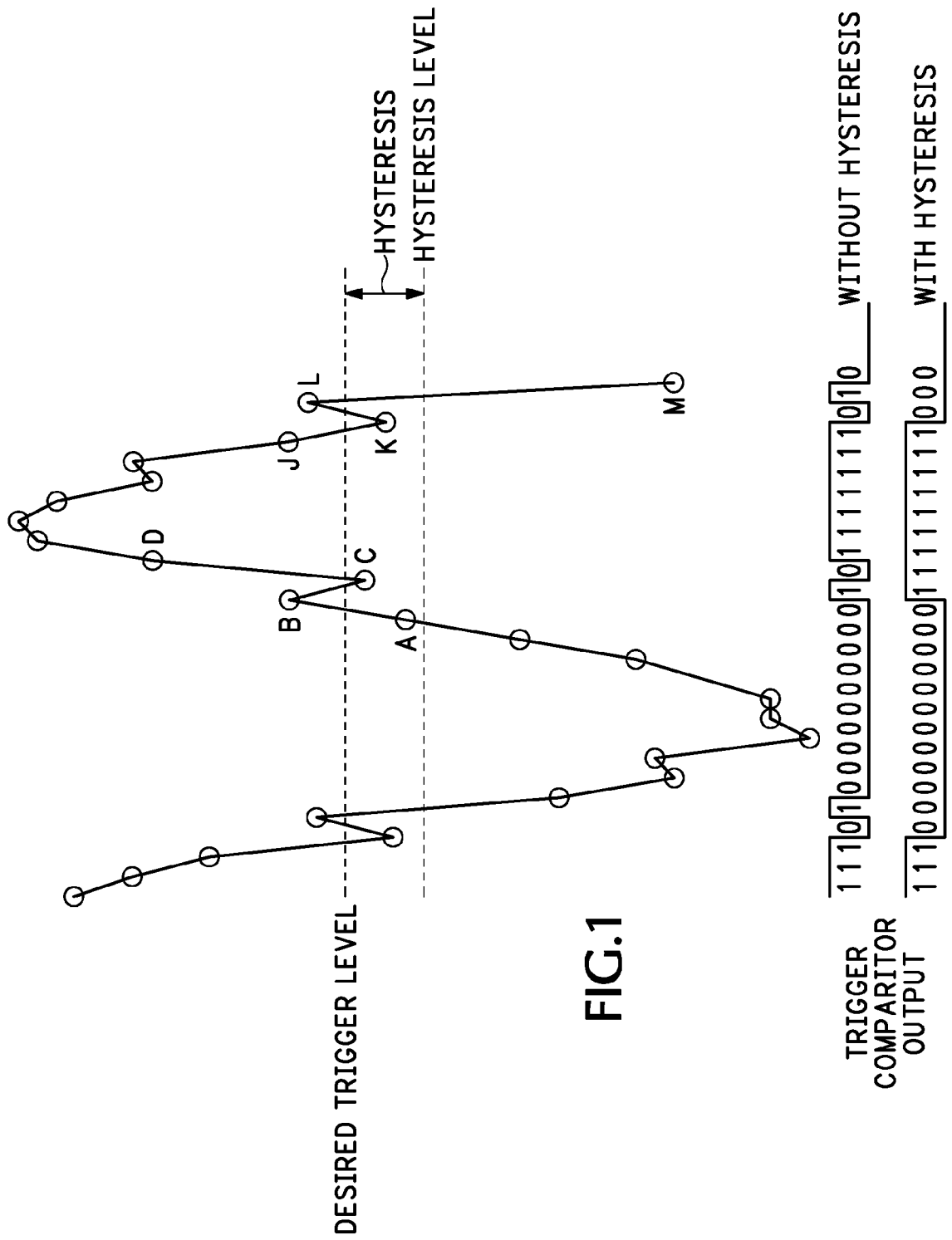
FIG. 1 is a graphic view of a noisy digitized input signal as processed by a trigger comparator having hysteresis according to the prior art.

The present invention has a trigger comparator that does not use hysteresis, so for the digitized signal of FIG. 1 the trigger comparator output observes all rising and falling trigger events, i.e., each crossing of a desired trigger level—only one trigger level is used. Therefore there is a rising trigger event on the transition from point A to point B; a falling trigger event on the transition from point B to point C; a rising trigger event on the transition from point C to point D; a falling trigger event on the transition from point J to point K; a rising trigger event on the transition from point K to point L; and a falling trigger event on the transition from point L to point M. A self-adjusting hold-off trigger circuit, as described below with respect to FIG. 2, measures the time between trigger events and computes an approximation of an average or peak time between trigger events. A trigger event is used for triggering signal acquisition when the time between a current qualified trigger event and a preceding trigger event is greater than the approximate average or peak time. Also only trigger events in a specified direction, such as rising trigger events, are used as qualified trigger events.

Figure 2:
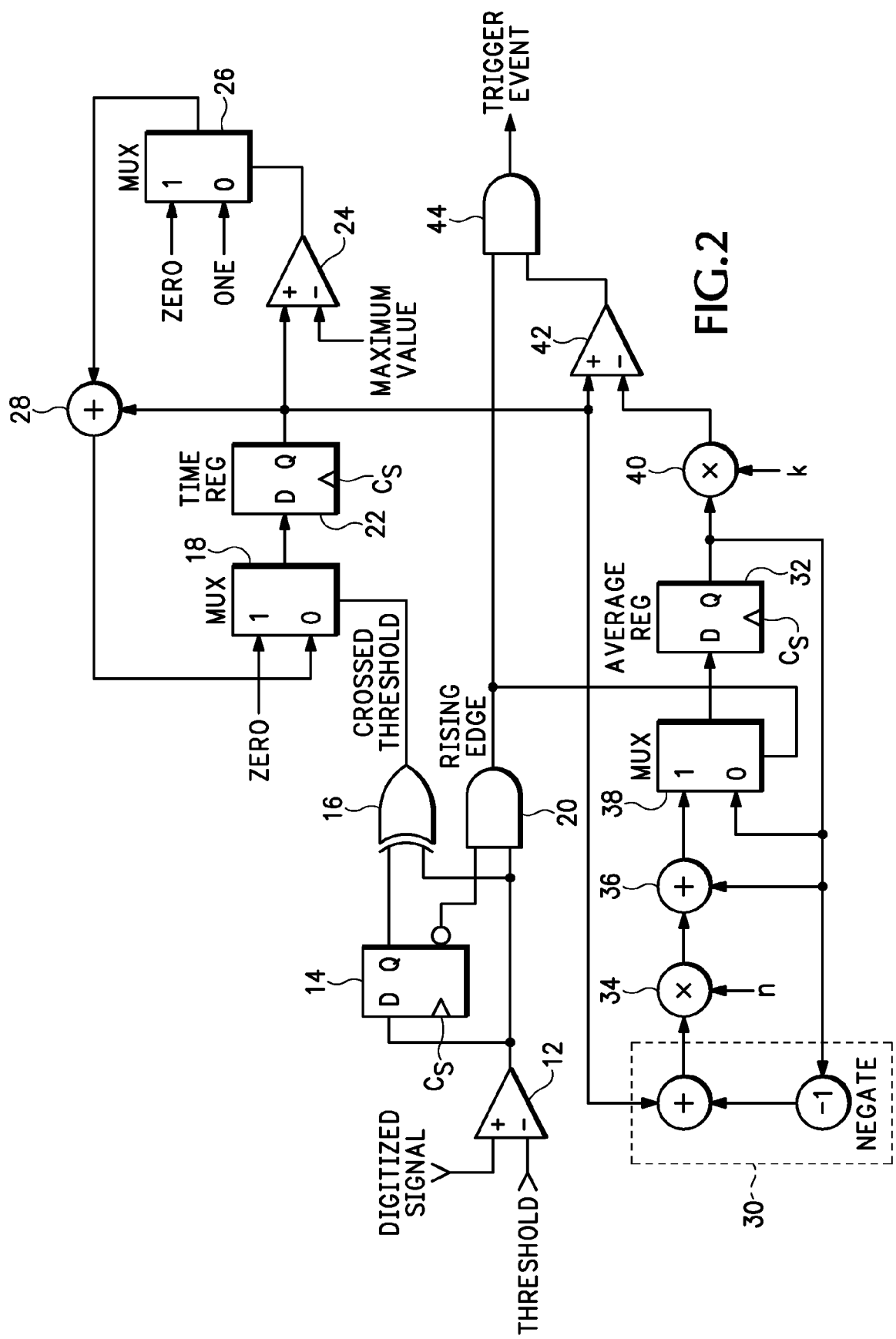
FIG. 2 is a block diagram view of an illustrative self-adjusting hold-off trigger circuit according to the present invention.

Referring now to FIG. 2 the digitized input signal is compared with a threshold level in a digital comparator 12, which converts the digitized input signal to a binary signal—values above the threshold are given a logical value of "1" and values below the threshold are given a logical value of "0". Referring to FIG. 1 the output of the comparator for a portion of the digitized signal becomes "111010000000101111111010" ending with point M, as shown by the comparator output without hysteresis. The binary signal is input to a flip-flop 14 which is clocked by a sample clock. The output and input of the flip-flop 14 are compared by an XOR gate 16 to provide a control signal for a first timing multiplexer 18, which control signal is indicative of a binary transition or crossing of the trigger level or threshold between samples of the input signal. Also the inverted output from the flip-flop 14 is input to an AND gate 20 together with the binary signal. The AND gate 20 is used to detect a desired crossing direction for the binary signal, i.e., a transition from "0" to "1" indicative of a rising edge for the described embodiment. In other words the output of the AND gate 20 provides qualified trigger events—trigger events that satisfy a desired trigger criteria such as rising edges in this example.

For each threshold crossing detected by the XOR gate 16, the first timing multiplexer 18 selects a constant value—"0" (as shown) or "1" depending upon a desired starting count value. The value from the first timing multiplexer 18 is loaded into a time register 22 each sample clock cycle, the output of which is coupled to a maximum time comparator 24 that is used to prevent the time value from getting too large in the event the input signal has a significant drop-out period. If the time stored in the time register 22 exceeds the maximum value applied to the maximum time comparator 24, then a second timing multiplexer 26 selects a "zero" increment for adding back to the time register via an adder 28. The output from the maximum time comparator 24 may also be used to provide a flag to a user that there is a gross error in the input signal. Otherwise the second timing multiplexer 26 selects a "one" increment for input to an adder 28 to increase the time value stored in the time register 22 via the first timing multiplexer 18. Thus the time loop increments the time value in the time register 22 each sample clock cycle so long as there is no trigger level crossing detected; resets the time value for each detected trigger level crossing; and keeps the time value from exceeding a predetermined maximum value.

The time value from the time register 22 also is input to a subtractor 30 where a current average value from an average register 32 is subtracted from the time value. The result from the subtractor 30 is adjusted in a first multiplier 34 by a first factor, n, and added to the current average value in an average adder 36. The average value and the output from the average adder 36 are input to a second multiplexer 38. The output from the second multiplexer 38 is determined by the direction signal from the AND gate 20. If there is no rising edge, then the current average value is transferred back into the average register 32. If there is a rising edge, then the updated average value from the average adder 36 is loaded into the average register 32. The average value from the average register 32 is multiplied (40) by a second factor, k, and applied as an approximate average level to an output comparator 42. Also input to the output comparator 42 is the time value from the time register 22. The output comparator 42 provides an enable signal to an output AND gate 44. Also input to the output AND gate 44 is the direction signal from the AND gate 20. When a rising edge occurs and the time value representing time from the preceding edge of the digitized input signal exceeds the approximate average value, the output AND gate 44 provides a trigger event for signal acquisition. The factors, n and k, generally have a value between zero and one.

Although the above description applies to a rising edge trigger circuit, appropriate modifications may be made to produce a falling edge trigger circuit. Also where multiple pipes of samples resulting from oversampling of the input signal to produce multiple samples per sample clock are used, the process described above may be readily applied. Further trigger events may be implemented that use more complex qualifiers, such as a specific pulse width, a serial data packet, etc. For these higher level qualifiers, the hold-off may be adjusted at this higher level, i.e., triggering when the average time between serial data packets between devices exceeds the average, or the like.

Figure 3:
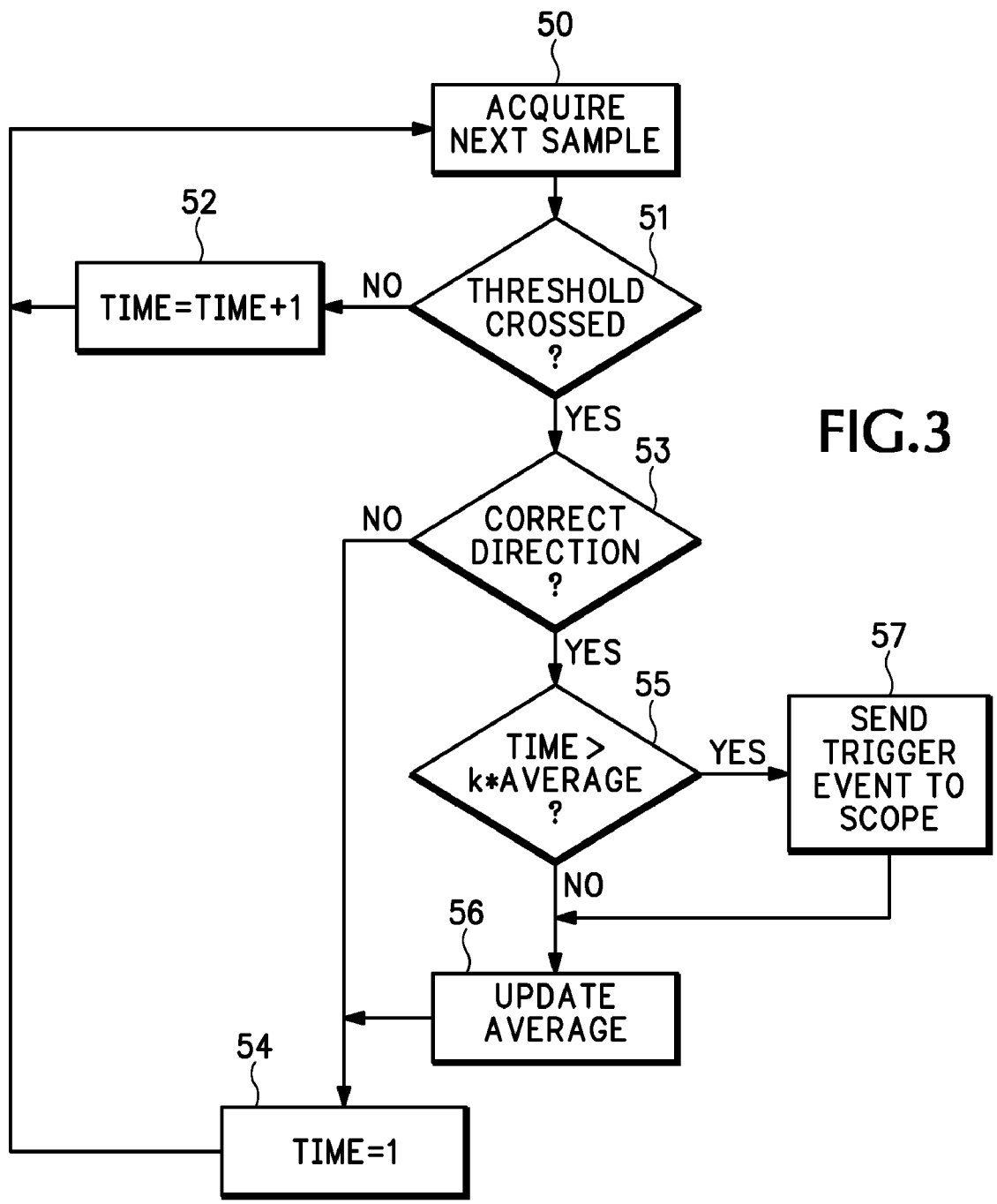
FIG. 3 is a flow diagram view for a self-adjusting hold-off trigger method using approximate average time according to the present invention.

The basic concept is further illustrated by the flow diagram of FIG. 3 where each sample is processed in turn. A current acquired sample, step 50, is tested to determine whether the trigger level or threshold has been crossed from an immediately previous sample, step 51. If the trigger level is not crossed by the current sample, then the time is incremented, step 52, and the next sample is acquired from the input signal, step 50. If the threshold is crossed, the direction of the crossing (rising or falling) is tested, step 53, depending upon whether the trigger circuit is configured for triggering on rising or falling edges. If the crossing is in the wrong direction, then the time is reset, step 54, and the next sample acquired, step 50. Otherwise the current time value is tested, step 55, to determine whether it exceeds an approximate average value. If the approximate average is not exceeded, then the average is updated by the current time, step 56, and time is reset, step 54, for acquisition of the next sample, step 50. If the approximate average is exceeded, then a trigger event is output, step 57, the average is updated, step 56, and the time is reset, step 54, for the next sample acquisition, step 50. The update average step 56 illustratively may be:

$$AVERAGE = AVERAGE + (TIME - AVERAGE)/8$$

where n=⅛.

Figure 4:
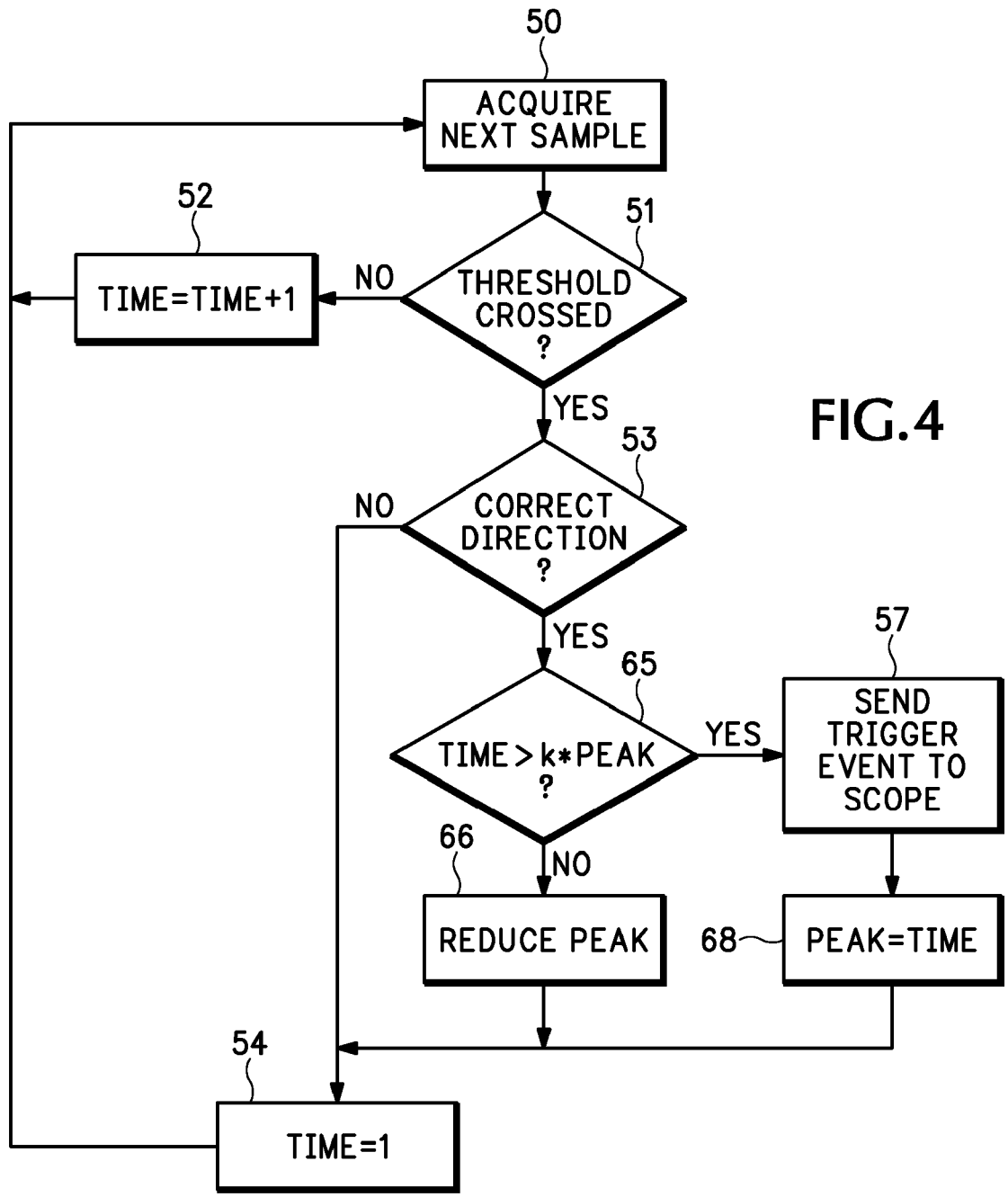
FIG. 4 is a flow diagram view for a self-adjusting hold-off trigger method using approximate peak time according to the present invention.

A similar algorithm may be used to use peak time values rather than average time values as the trigger criteria, as shown in FIG. 4, so that triggering occurs on the peak interval values of the input signal. In this case time is compared to an approximate peak time value, step 65, rather than an approximate average time value. If the approximate peak time value is not exceeded, then the peak time value is reduced, step 66, such as PEAK=PEAK*n. Otherwise the trigger event is output, step 57, the peak time value is set to the current time value, step 68, and time is reset, step 54. In this way the peak time value represents the longest interval between qualified trigger events.

Thus the present invention provides a self-adjusting hold-off trigger by detecting each crossing of a trigger level by a digitized input signal as edge events, qualifying each edge event as a qualified trigger event if the crossing is in the desired direction, and generating a trigger output when a qualified trigger event occurs that exceeds an average or peak time from a preceding edge event.

What is claimed is:

1. A method of generating a self-adjusting hold-off trigger comprising the steps of:
   generating qualified trigger events from a digitized input signal based upon threshold crossings by the digitized input signal and upon trigger criteria;
   providing a trigger output for acquiring the digitized input signal for each of the qualified trigger events that occurs greater than an approximate time after an immediately preceding threshold crossing; and
   updating the approximate time after each qualified trigger event.

2. The method as recited in claim 1 wherein the updating step comprises the steps of:
   determining a time between each qualified trigger event and the immediately preceding threshold crossing; and
   averaging the times to produce an average time between qualified trigger events and immediately preceding threshold crossings as the approximate time.

3. The method as recited in claim 2 wherein the updating step further comprises the step of multiplying the average time by a factor to produce the approximate time.

4. The method as recited in claim 1 wherein the updating step comprises the steps of:
   determining a time between each qualified trigger event and the immediately preceding threshold crossing; and
   setting a peak time value equal to the time when the trigger output produced in the providing step, the peak time value being the approximate time.

5. The method as recited in claim 4 wherein the updating step further comprises the step of reducing the peak time value by a factor to produce the approximate time.

6. A self-adjusting hold-off trigger apparatus comprising:
   means for determining qualified trigger events from a digitized input signal based upon threshold crossings and upon trigger criteria;
   means for providing a trigger output for acquiring the digitized input signal for each of the qualified trigger events that occurs greater than an approximate time after an immediately preceding threshold crossing; and
   means for updating the approximate time after each qualified trigger event.

7. The apparatus as recited in claim 6 wherein the updating means comprises:
   means for determining a time between each qualified trigger event and the immediately preceding threshold crossing; and
   means for averaging the times to produce an average time between qualified trigger events and immediately preceding threshold crossings as the approximate time.

8. The apparatus as recited in claim 7 wherein the updating means further comprising means for multiplying the average time by a factor to produce the approximate time.

9. The apparatus as recited in claim 6 the updating means comprises:
   means for determining a time between each qualified trigger event and the immediately preceding threshold crossing; and
   means for setting a peak time value equal to the time when the trigger output produced in the providing step, the peak time value being the approximate time.

10. The apparatus as recited in claim 9 wherein the updating means further comprises means for reducing the peak time value by a factor to produce the approximate time.

11. A self-adjusting hold-off trigger apparatus comprising:
    a threshold detector and qualifier circuit having as inputs a digitized input signal and a threshold level, and having as outputs edge events indicative of the digitized input signal crossing the threshold level and qualified trigger events corresponding to the edge events that meet trigger criteria;
    a timing loop having as inputs the edge events from the threshold detector and a reset constant, and having as an output a time between edge events wherein the time is returned to the reset constant at each edge event and periodically increased by a selected increment between edge events;
    an approximate time update circuit having as inputs the qualified trigger events and the time from the timing loop, and having as an output an approximate time that is a function of the inputs; and
    an output circuit having as inputs the time from the timing loop, the approximate time and the qualified trigger events, and having as an output a trigger event for acquiring the digitized input signal for each qualified trigger event where the time from the timing loop exceeds the approximate time.

12. The apparatus as recited in claim 11 further comprising a maximum time logic having as inputs the time from the timing loop, a maximum time value and a plurality increments, and having as an output a selected one of the increments as the selected increment for the timing loop, the selected increment being zero when the time exceeds the maximum time value to hold the time at the maximum time value until a next one of the edge events is output from the threshold detector and qualifier circuit.

* * * * *